(12) United States Patent
Shim

(10) Patent No.: US 7,843,065 B2
(45) Date of Patent: Nov. 30, 2010

(54) FLASH MEMORY DEVICE AND FABRICATING METHOD THEREOF

(75) Inventor: Cheon Man Shim, Seoul (KR)

(73) Assignee: Dongbu Hitek Co., Ltd., Sunnyvale, CA (US)

( * ) Notice: Subject to any disclaimer, the term of this patent is extended or adjusted under 35 U.S.C. 154(b) by 0 days.

(21) Appl. No.: 12/235,889

(22) Filed: Sep. 23, 2008

(65) Prior Publication Data

US 2009/0085218 A1 Apr. 2, 2009

(30) Foreign Application Priority Data

Sep. 28, 2007 (KR) .................... 10-2007-0097888

(51) Int. Cl.
*H01L 23/48* (2006.01)
*H01L 29/40* (2006.01)

(52) U.S. Cl. .................. 257/758; 257/774; 257/750; 438/622

(58) Field of Classification Search ............... 257/758, 257/750, 774, E23.01, E21.495; 438/622
See application file for complete search history.

(56) References Cited

U.S. PATENT DOCUMENTS 7,572,734 B2 * 8/2009 Naik et al. ............... 438/702
2004/0207092 A1 * 10/2004 Burrell et al. ............ 257/758

* cited by examiner

*Primary Examiner*—Theresa T Doan
(74) *Attorney, Agent, or Firm*—Workman Nydegger

(57) ABSTRACT

A flash memory device may include a first insulating layer on a base insulating layer on a substrate, a lower wire layer that fills a trench in the first insulating layer, a first insulating interlayer and a second insulating layer stacked in sequence on the first insulating layer and the lower wire layer, a middle wire layer that fills a trench in the second insulating layer, and a second insulating interlayer and an upper wire layer stacked in sequence on the middle wire layer, wherein the lower wire layer, the middle wire layer and the upper wire layer may be electrically connected to each other and the first insulating layer may include a low-k layer in contact with the base insulating layer. In addition, each of the first insulating interlayer, the second insulating layer, and the second insulating interlayer may include an FSG layer.

9 Claims, 7 Drawing Sheets

FLASH MEMORY DEVICE AND FABRICATING METHOD THEREOF

CROSS-REFERENCE TO RELATED APPLICATION

This application claims the benefit of the Korean Patent Application No. 10-2007-0097888, filed on Sep. 28, 2007, which is hereby incorporated by reference in its entirety.

BACKGROUND

1. Field of the Invention

Embodiments of the present invention relate to a flash memory device and a fabricating method thereof suitable for solving the problem of reduced reliability of highly-integrated devices, among other things.

2. Discussion of the Related Art

Recently, demand is rising for nonvolatile memory (NVM) devices (flash memory devices), which do not require periodic memory refreshes and are capable of electrical programming (i.e., writing data to a memory cell) and erasing (i.e., removing data written to a memory cell).

Generally, flash memory devices can be categorized into two types. A NAND type flash memory device includes a plurality of serially connected memory cells (i.e., drain or source is shared by adjacent cells) to configure a single string. A NOR type flash memory device includes a plurality of memory cells connected in parallel with each other.

Unlike the NOR type flash memory device, the NAND type flash memory device has a characteristic of reading information sequentially and a characteristic of performing programming and erasing by controlling a threshold voltage (Vt) of a memory cell. Controlling Vt may be achieved by injecting/discharging electrons into/from a floating gate by Fowler-Nordheim (F-N) tunneling.

Many efforts are made to research and develop high-integration technology to implement a large-size memory device capable of storing more data. High integration of a flash memory device introduces a problem of RC (resistive capacitive) delay, which is caused by resistance and parasitic capacitance. To address such problems, a low-resistance wire such as a Cu wire may be adopted and a low-k substance having a dielectric constant of 3.0 or below may be used as a dielectric.

However, the use of a low dielectric substance degrades device reliability because the surface characteristics of a low dielectric substance typically cause it to adhere poorly to metal.

FIG. 1A shows a wire pulling test. Referring to FIG. 1A, wire bonding is performed to connect a pad 10 of a device to a lead frame 20 with a wire 30. A wire pulling test is then performed to measure an amount of force required to cut or break the wire 30 by applying a force to the wire 30 in a direction (A).

FIGS. 1B to 1E show peeling phenomena. FIGS. 1B to 1E are optical microscope images of a part having a peeling phenomenon in a flash memory device and cross-sectional images by FIB (focused ion beam) and SEM (scanning electron microscope).

If a lower structure of a flash memory device is vulnerable, when the wire 30 is bonded to the pad 10, peeling phenomena occur, as shown in FIGS. 1B to 1E. Consequently, the wire 30 has a weak bond with the pad 10. Thus, if the peeling phenomenon occurs, packaging becomes impossible and the flash memory device becomes unusable.

SUMMARY OF SOME EXAMPLE EMBODIMENTS

In general, example embodiments of the invention relate to a flash memory device and fabricating method thereof that substantially obviate one or more problems due to limitations and disadvantages of the related art.

For example, embodiments of the present invention relate to providing a flash memory device and fabricating method thereof by which RC delay is reduced and by which peeling can be reduced or prevented.

According to a first embodiment, a flash memory device may include a first insulating layer on a base insulating layer on a substrate, a lower wire layer that fills a trench in the first insulating layer, a first insulating interlayer and a second insulating layer stacked in sequence on the first insulating layer and the lower wire layer, a middle wire layer that fills a trench in the second insulating layer, and a second insulating interlayer and an upper wire layer stacked in sequence on the middle wire layer. The lower wire layer, the middle wire layer and the upper wire layer may be electrically connected to each other. In addition, the first insulating layer may include a low-k layer contacted with the base insulating layer and each of the first insulating interlayer, the second insulating layer, and the second insulating interlayer may include an FSG layer.

According to a second embodiment, a method of fabricating a flash memory device may include the steps of forming a first insulating layer on a base insulating layer on a substrate, forming a trench in the first insulating layer, forming a lower wire layer by filling the trench in the first insulating layer, forming a first insulating interlayer and a second insulating layer over the substrate including the lower wire layer, forming a first contact hole in the first insulating interlayer and forming a trench in the second insulating layer, forming a first gap-fill layer by filling the first contact hole and forming a middle wire layer by filling the trench in the second insulating layer, forming a second insulating interlayer over the substrate including the middle wire layer and then forming a second contact hole by selectively removing the second insulating interlayer, and forming a second gap-fill layer by filling the second contact hole and an upper wire layer on the second insulating interlayer.

Embodiments of the present invention also relate to preventing RC delay incidental to high integration by using Cu wire and a low-k substance. For example, a first insulating layer having a lower wire layer may include a low-k substance layer configured to contact with a base insulating layer. In addition, an insulating interlayer and a second insulating layer may each include an FSG layer having mechanical properties better than those of the low-k substance layer. Therefore, mechanical reliability may be enhanced.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features will be set forth in the description which follows, and in part will be obvious from the description, or may be learned by the practice of the teachings herein. Features of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

Aspects of example embodiments of the invention will become apparent from the following description of example embodiments given in conjunction with the accompanying drawings, in which.

DETAILED DESCRIPTION OF SOME EXAMPLE EMBODIMENTS

Figure 1A:
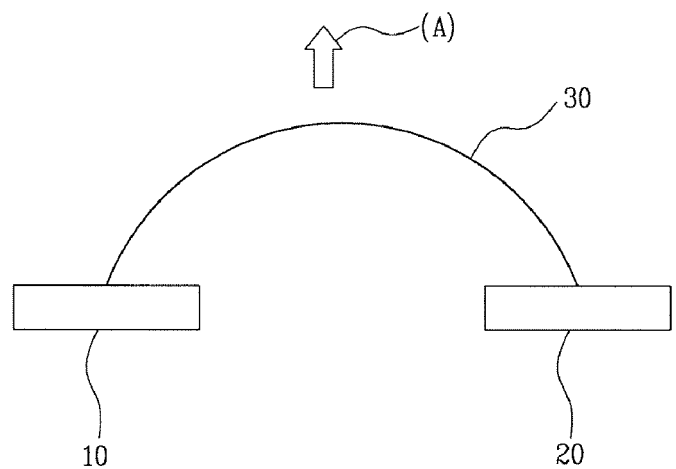
FIG. 1A is a diagram showing a wire pulling test.
Figure 1B:
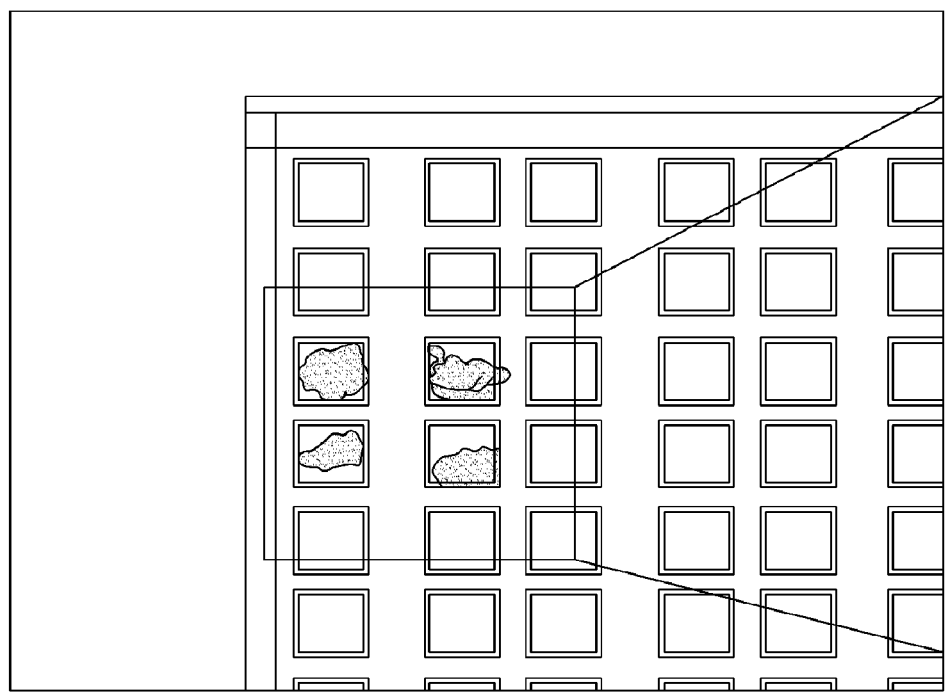
FIGS. 1B to 1E are diagrams showing peeling.
Figure 1C:
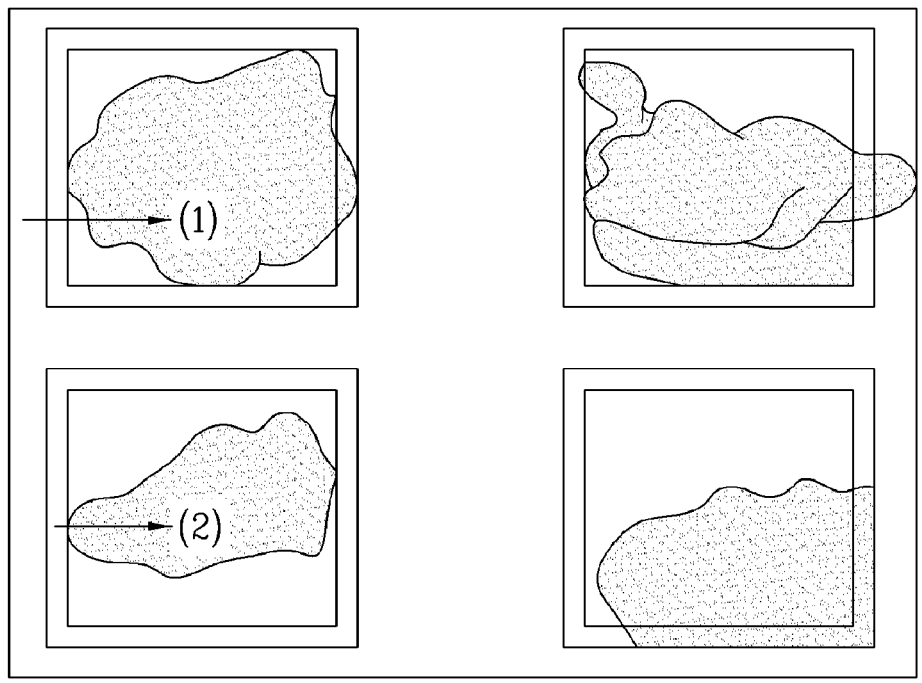
Figure 1D:
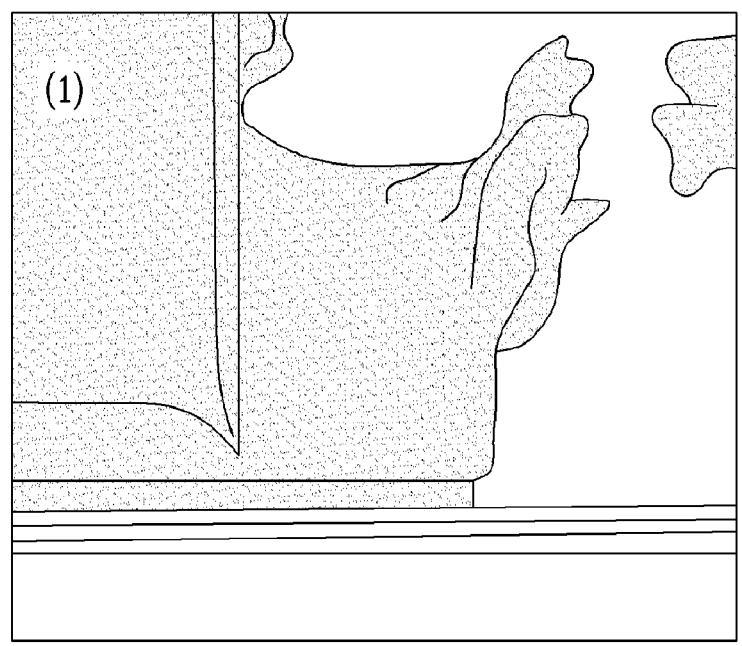
Figure 1E:
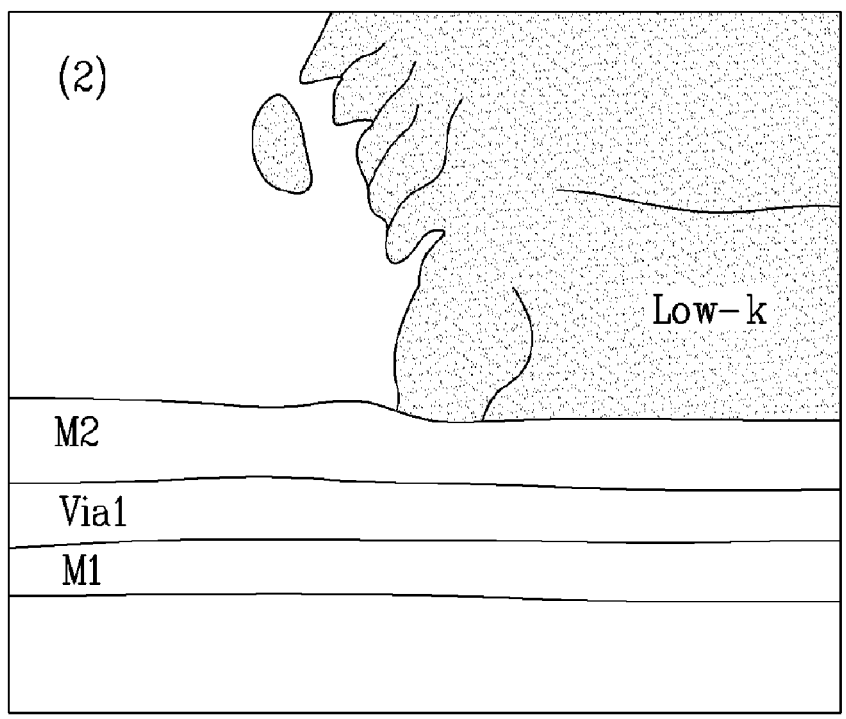

In the following detailed description of the example embodiments, reference is made to the accompanying drawings that show, by way of illustration, specific embodiments of the invention. In the drawings, like numerals describe substantially similar components throughout the several views. These embodiments are described in sufficient detail to enable those skilled in the art to practice the invention. Other embodiments may be utilized and structural, logical and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

Figure 2:
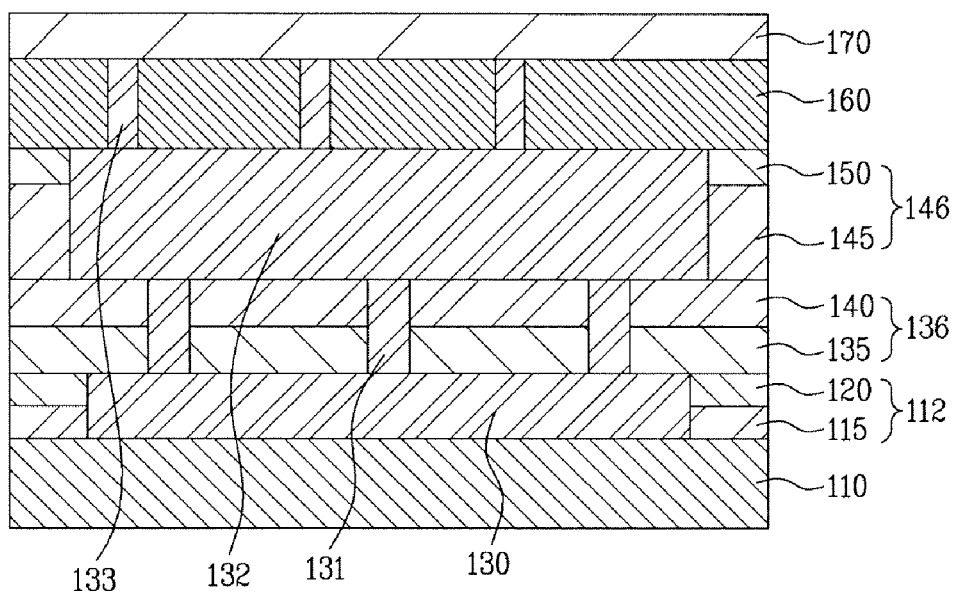
FIG. 2 is a cross-sectional diagram showing a flash memory device according to an embodiment of the present invention.

FIG. 2 is a cross-sectional diagram of 3-metal flash memory device fabricated with a 90 nm or below semiconductor process according to an embodiment of the present invention.

Referring to FIG. 2, a flash memory device may include a substrate (not shown in the drawing), a base insulating layer 110, a first insulating layer 112, a lower wire layer 130, a first insulating interlayer 136, a first gap-fill layer 131, a second insulating layer 146, a middle wire layer 132, a second insulating interlayer 160, a second gap-fill layer 133 and an upper wire layer 170.

The base insulating layer 110 may be provided onto the substrate (not shown in the drawing) and can include a USG (Undoped Silicate Glass) layer. The first insulating layer 112 may be formed on the base insulating layer 110. The first insulating layer 112, as shown in FIG. 2, may include a first dielectric layer 115 and a first USG layer 120 stacked on the first dielectric layer 115.

The first dielectric layer 115 may be formed of a SSQ (silsesquioxane) based low-k substance, such as HSQ (Hydrogen-silsesquioxane) or MSQ (Methyl-silsesquioxane) or a low-k substance having a dielectric constant of 3.0 or below, such as a silica based low-k substance or an organic polymer based low-k substance.

The lower wire layer 130 may be formed on an area resulting from removing a portion of the first insulating layer 112 to expose the base insulating layer 110.

The first insulating interlayer 136 may be formed on the first insulating layer 112 and the lower wire layer 130. The first insulating interlayer 136 may include a first barrier layer 135 and a second dielectric layer 140 stacked on the first barrier layer 135. In addition, a USG layer (not shown in the drawing) may be further formed between the first barrier layer 135 and the second dielectric layer 140. In certain embodiments, the first barrier layer 135 may be formed of SiCN and the second dielectric layer 140 may be formed of FSG (fluorine doped silicate glass).

The first gap-fill layer 131 may gap-fill a first contact hole resulting from removal of at least a portion of the first insulating interlayer 136 sufficient to expose the lower wire layer 130.

The second insulating layer 146 may be formed on the first gap-fill layer 131 and the first insulating interlayer 136. The second insulating layer 146 may include a third dielectric layer 145 and a second USG layer 150 stacked on the dielectric layer 145. The third dielectric layer 145 and the second dielectric layer 140 may be formed of the same substance, FSG.

The middle wire layer 132 may be formed on an area resulting from selective removal of at least a portion of the second insulating layer 146 to include at least an area corresponding to the first contact hole in the first insulating interlayer 136.

The second insulating interlayer 160 may be formed on the second insulating layer 146 and the middle wire layer 132. The second insulating interlayer 160 may include a second barrier layer and a fourth dielectric layer (not shown in the drawing). In addition, a USG layer may be further provided on and beneath the fourth dielectric layer. In certain embodiments, the second barrier layer (not shown in the drawing) may be formed of SiN and the fourth dielectric layer (not shown in the drawing) may be formed of FSG (fluorine doped silicate glass).

The second gap-fill layer 133 may gap-fill a second contact hole resulting from removal of a portion of the second insulating interlayer 160 to expose the middle wire layer 132. The upper wire layer 170 may be formed on the second insulating interlayer 160 and the second gap-fill layer 133.

The lower wire layer 130, the middle wire layer 132, the first gap-fill layer 131 and the second gap-fill layer 133 may be formed of low-resistance metal such as Cu. If Cu is used to form the lower wire layer 130, the middle wire layer 132, the first gap-fill layer 131, and the second gap-fill layer 133, a barrier metal layer (not shown in the drawing) may be formed to enclose the Cu layer to prevent CU diffusion. The upper wire layer 170 may be formed of Al.

In summary, in a flash memory device, a dielectric layer in a first insulating layer including a trench for accommodating a lower wire layer may be formed of a low-k substance having a dielectric constant of 3 or below. Alternatively or in addition, a dielectric layer on an interface between a middle wire layer and a first insulating interlayer, to which a greatest degree of pressure is applied in wire bonding, may be formed of FSG. Consequently, peeling of a wire bonding and RC delay may be prevented or reduced.

A method of fabricating a flash memory device according to an embodiment of the present invention is explained as follows.

FIGS. 3A to 3H are cross-sectional diagrams showing a method of fabricating a flash memory device according to an embodiment of the present invention.

Figure 3A:
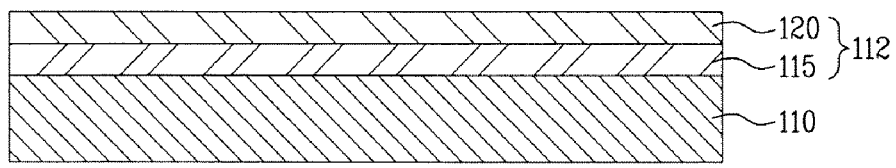
FIGS. 3A to 3H are cross-sectional diagrams showing a method of fabricating a flash memory device according to an embodiment of the present invention.

Referring to FIG. 3A, a first insulating layer 112 may be formed on a base insulating layer 110 on a substrate (not shown in the drawing). For instance, the first insulating layer 112 may be formed by stacking a first dielectric layer 115 and a first USG layer 120 in sequence. The first dielectric layer 115 may be formed of a low-k substance having a dielectric constant of 3.0 or below.

Figure 3B:
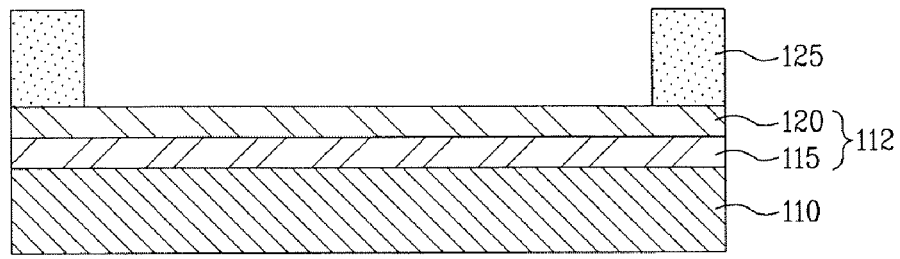

Referring to FIG. 3B, photoresist may be coated on the first insulating layer 112. A first photoresist pattern 125 may then be formed by performing exposure on the photoresist. The first photoresist pattern 125 may be formed to enable a partial area of the first insulating layer 112 to be exposed in preparation for forming a lower wire layer.

Figure 3C:
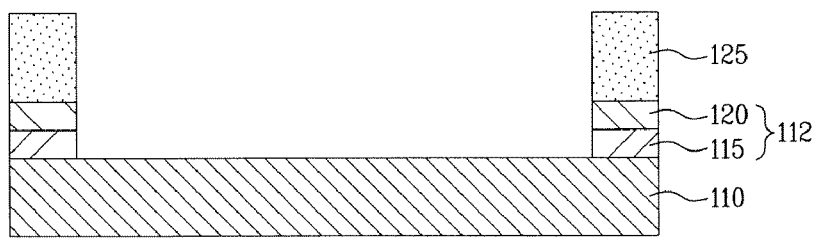

Referring to FIG. 3C, a trench for forming a lower wire layer may be formed by selectively removing the exposed first insulating layer 112 using the first photoresist pattern as a mask. The first photoresist pattern 125 may then be removed by ashing.

Figure 3D:
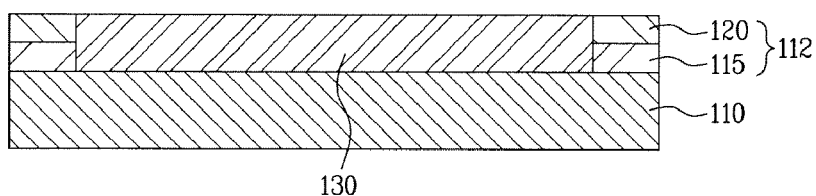

Referring to FIG. 3D, a lower wire layer 130 may be formed in the trench. For instance, the lower wire layer 130 may be formed by depositing low-resistance metal such as Cu to fill up the trench and then planarizing the deposited metal by CMP (chemical mechanical polishing) or the like.

Figure 3E:
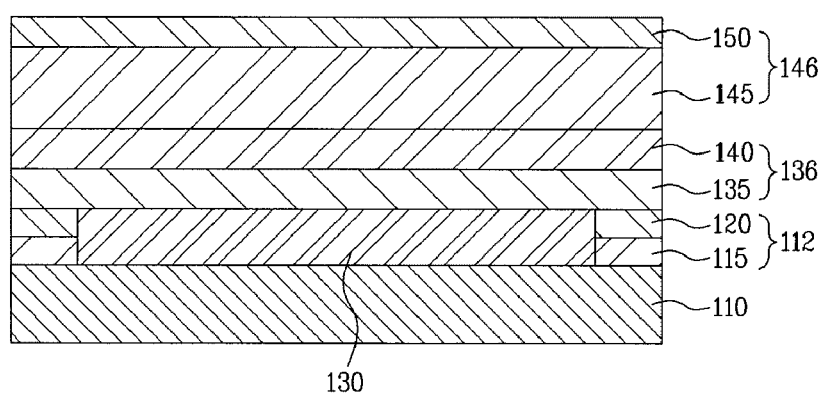

Referring to FIG. 3E, a first insulating interlayer 136 and a second insulating layer 146 may be stacked in sequence on the first insulating layer 112 and the lower wire layer 130.

For instance, the first insulating interlayer 136 may be formed by stacking a first barrier layer 135 and a second dielectric layer 140 in sequence. In addition, although not shown, a USG layer may be further formed between the first barrier layer 135 and the second dielectric layer 140.

The USG (Undoped Silicate Glass) layer optionally formed between layers 135 and 140 and/or one or more of the other USG layers described herein may include a TEOS (Tetra Ethyl Ortho Silicate)-based oxide or an SRO (Silicon-rich Oxide), such as a $SiH_4$-based oxide.

The first barrier layer 135 may be formed of SiCN and the second dielectric layer 140 may be formed of FSG. As the first insulating layer 112 under the first barrier layer 135 is formed with a base of a low-k substance and SiCN is an effective low-k barrier layer, the first barrier layer 135 can be formed of SiCN.

The second dielectric layer 140 may be formed of FSG having mechanical properties better than those of the low-k dielectric substance. In general, hardness of a low-k substance is equal to or smaller than 2 GPa and tensile strength (modulus) is equal to or smaller than 20 GPa. Hardness of FSG may be equal to or greater than 5 GPa and tensile strength may be equal to or greater than 50 GPa. Hence, it can be observed that mechanical properties of FSG are better than those of a low-k substance.

The second insulating layer 146 may be formed by stacking a dielectric layer 145 and a second USG layer 150 in sequence. In certain embodiments, the third dielectric layer 145 and the second dielectric layer 140 may be simultaneously formed of the same substance.

Figure 3F:
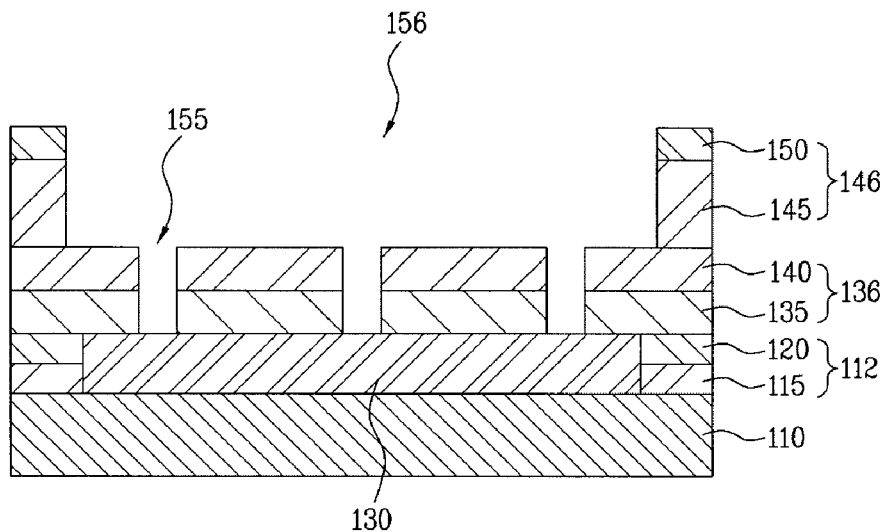

Referring to FIG. 3F, at least one first contact hole 155 may be formed to expose the lower wire layer 130 by selectively performing a first etch on the second insulating layer 146 and the first insulating interlayer 136. A trench 156 may then be formed to provide a middle wire layer therein by selectively performing a second etch on the second insulating layer 146. The at least one first contact hole 155 may also be formed to expose the lower wire layer 130 by perforating the second insulating layer 146 and the first insulating interlayer 136. The trench 156 may be formed to have a width encompassing the at least one first contact hole 155. Alternatively, the trench 156 may first formed and the at least one first contact hole 155 may then be formed.

Figure 3G:
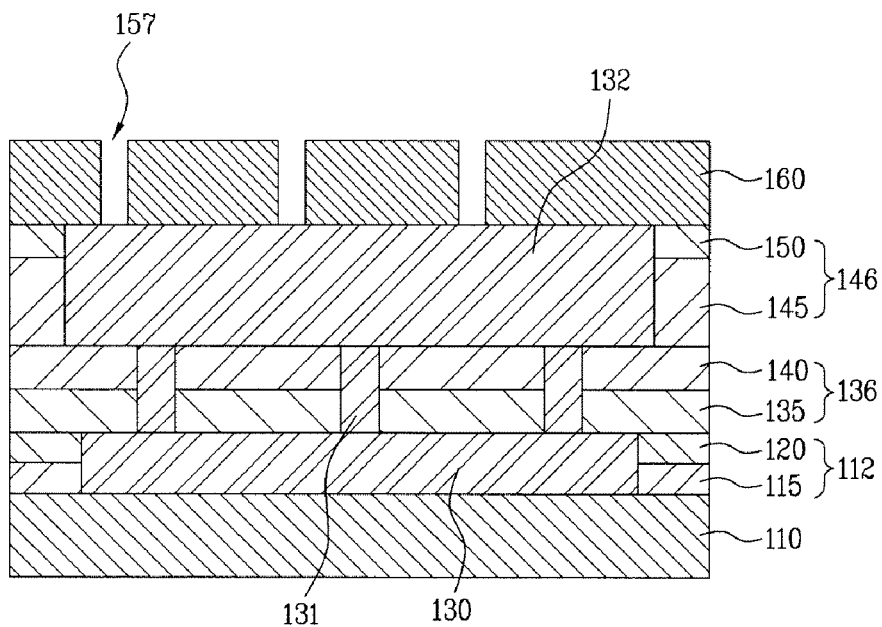

Referring to FIG. 3G, the at least one first contact hole 155 and the trench 156 may be filled up with a low-resistance metal, such as Cu, to form a first gap-fill layer 131 and a middle wire layer 132. For instance, the at least one first contact hole 155 may be filled up with CU to form the first gap-fill layer 131 and the trench 156 may be filled up with Cu to form the middle wire layer 132. In particular, the lower wire layer 130 and the middle wire layer 132 may be connected to each other via the first gap-fill layer 131.

After the middle wire layer 132 has been formed with the metal (e.g., Cu), a top of the middle wire layer 132 may be planarized by chemical mechanical polishing.

Subsequently, a second insulating interlayer 160 may be formed on the middle wire layer 132 and the second insulating layer 146. At least one second contact hole 157 may then be formed by selectively removing the second insulating interlayer 160 to expose the middle wire layer 132.

The second insulating interlayer 160 may be formed by stacking a second barrier layer (not shown in the drawing) and a fourth dielectric layer (not shown in the drawing) in sequence. In addition, a USG layer (not shown in the drawing) may be further formed onto and beneath the fourth dielectric layer. The fourth dielectric layer may be formed of FSG and the second barrier layer may be formed of SiN.

As the fourth dielectric layer on the second barrier layer and the second dielectric layer under the second barrier layer are formed of FSG and SiN is an effective G/FSG barrier layer, the second barrier layer can be formed of SiN.

Figure 3H:
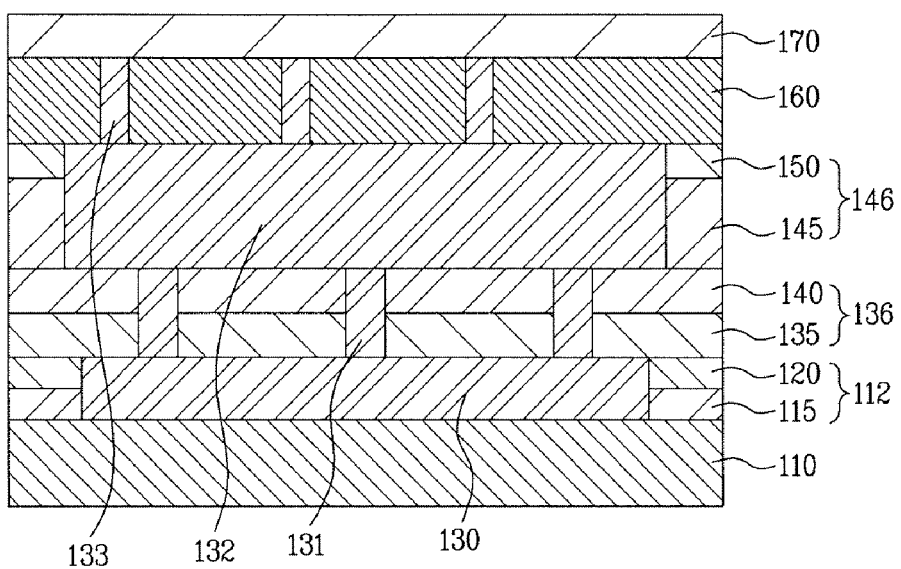

Referring to FIG. 3H, the at least one second contact hole 157 may be filled up with a low-resistance metal to form a second gap-fill layer 133. In addition, an upper wire layer 170 may be formed on the second gap-fill layer 133 and the second insulating interlayer 160. The upper wire layer 170 may be formed of Al.

In certain embodiments the lower wire layer 130, the middle wire layer 132, the first gap-fill layer 131 and the second gap-fill layer 133 may be formed of Cu. In these embodiments, a step of forming a barrier metal layer on each surface of the Cu layers may be further included.

Accordingly, in a method of fabricating a flash memory device according to an embodiment of the present invention, a dielectric layer of a first insulating layer including a trench for accommodating a lower wire layer therein may be formed of a low-k substance. In addition, a dielectric layer on an interface between a middle wire layer and a first insulating interlayer, to which a greatest degree of pressure is applied in wire bonding, may be formed of FSG. Consequently, peeling of a wire bonding and RC delay may be reduced or prevented.

While the present invention has been described with respect to example embodiments, it will be apparent to those skilled in the art that various changes and modifications may be made without departing from the scope of the present invention as defined in the following claims.

What is claimed is:

1. A flash memory device comprising:
    a first insulating layer on a base insulating layer on a substrate;
    a lower wire layer that fills a trench in the first insulating layer;
    a first insulating interlayer and a second insulating layer stacked in sequence on the first insulating layer and the lower wire layer;
    a middle wire layer that fills a trench in the second insulating layer; and
    a second insulating interlayer and an upper wire layer stacked in sequence on the middle wire layer,
    wherein the lower wire layer, the middle wire layer and the upper wire layer are electrically connected to each other, wherein the first insulating layer includes a low-k layer in contact with the base insulating layer, wherein each of the first insulating interlayer, the second insulating layer, and the second insulating interlayer includes an FSG layer; and wherein a first FSG layer included in the first insulating interlayer and a second FSG layer included in the second insulating layer are formed in an interface between the middle wire layer and the first insulating interlayer.

2. The flash memory device of claim 1, wherein the first insulating layer comprises a first dielectric layer and a first USG layer stacked on the first dielectric layer.

3. The flash memory device of claim 1, wherein the first dielectric layer comprises at least one of a silica based low-k substance having a dielectric constant of 3.0 or less, an organic polymer based low-k substance having a dielectric constant of 3.0 or less, or an SSQ based low-k substance that includes HSQ or MSQ.

4. The flash memory device of claim 1, wherein the lower wire layer is formed on an area in which a portion of the first insulating layer is removed to expose the base insulating layer.

5. The flash memory device of claim 1, wherein the first insulating interlayer comprises a first barrier layer and a second dielectric layer stacked on the first barrier layer.

6. The flash memory device of claim 5, wherein the first barrier layer comprises SiCN and wherein the second dielectric layer comprises FSG.

7. The flash memory device of claim 1, wherein the lower wire layer and the middle wire layer are electrically connected to each other via a first gap-fill layer within a first contact hole in the first insulating interlayer, and wherein the middle wire layer and the upper wire layer are electrically connected to each other via a second gap-fill layer within a second contact hole in the second insulating interlayer.

8. The flash memory device of claim 7, wherein the lower wire layer, the middle wire layer, the first gap-fill layer and the second gap-fill layer are formed of Cu and wherein the upper wire layer is formed of Al.

9. The flash memory device of claim 5, wherein the second insulating layer comprises a third dielectric layer and a second USG layer stacked on the third dielectric layer and wherein the third dielectric layer and the second dielectric layer are formed of a same substance.

* * * * *